(12) United States Patent
Noel et al.

(10) Patent No.: US 10,910,040 B2
(45) Date of Patent: Feb. 2, 2021

(54) MEMORY CIRCUIT

(71) Applicant: Commissariat à l'Énergie Atomique et aux Énergies Alternatives, Paris (FR)

(72) Inventors: Jean-Philippe Noel, Eybens (FR); Bastien Giraud, Voreppe (FR); Adam Makosiej, Grenoble (FR)

(73) Assignee: Commissariat à l'Énergie Atomique et aux Énergies Alternatives, Paris (FR)

( * ) Notice: Subject to any disclaimer, the term of this patent is extended or adjusted under 35 U.S.C. 154(b) by 125 days.

(21) Appl. No.: 16/231,248

(22) Filed: Dec. 21, 2018

(65) Prior Publication Data
US 2019/0198094 A1 Jun. 27, 2019

(30) Foreign Application Priority Data

Dec. 26, 2017 (FR) ..................................... 17 63221

(51) Int. Cl.
| | |
|---|---|
| G11C 11/00 | (2006.01) |
| G11C 11/419 | (2006.01) |
| G11C 13/00 | (2006.01) |
| G11C 7/10 | (2006.01) |
| G11C 11/412 | (2006.01) |

(Continued)

(52) U.S. Cl.
CPC ............ *G11C 11/419* (2013.01); *G11C 5/025* (2013.01); *G11C 5/063* (2013.01); *G11C 7/1006* (2013.01); *G11C 7/1066* (2013.01); *G11C 7/1069* (2013.01); *G11C 7/1093* (2013.01); *G11C 7/1096* (2013.01); *G11C 7/18* (2013.01); *G11C 11/412* (2013.01); *G11C 11/417* (2013.01); *G11C 13/003* (2013.01); *G11C 13/004* (2013.01); *G11C 13/0069* (2013.01); *H03K 19/177* (2013.01); *G11C 8/12* (2013.01); *G11C 11/405* (2013.01); *G11C 11/407* (2013.01); *G11C 11/4085* (2013.01);
(Continued)

(58) Field of Classification Search
CPC ..... G11C 11/34; G11C 11/405; G11C 11/408; G11C 11/409; G11C 11/412; G11C 11/417; G11C 11/419; G11C 13/00; G11C 5/02; G11C 5/06; G11C 7/18; G11C 7/19; G11C 8/12

See application file for complete search history.

(56) References Cited

U.S. PATENT DOCUMENTS

| | | | |
|---|---|---|---|
| 5,594,698 | A | 1/1997 | Freeman |
| 6,452,841 | B1 | 9/2002 | Ferrant |

(Continued)

OTHER PUBLICATIONS

FR1763221, Sep. 24, 2018, Preliminary Search Report.

(Continued)

*Primary Examiner* — Hien N Nguyen
(74) *Attorney, Agent, or Firm* — Wolf, Greenfield & Sacks, P.C.

(57) ABSTRACT

A memory circuit including a plurality of elementary cells arranged in a plurality of arrays, each including a plurality of rows and a plurality of columns, and wherein: the elementary cells having the same coordinates in the different arrays share a same first conductive track; and in each array, the elementary cells of a same row of the array share a same second conductive track and a same third conductive track.

10 Claims, 4 Drawing Sheets

(51) Int. Cl.
  *G11C 7/18* (2006.01)
  *G11C 11/417* (2006.01)
  *G11C 5/06* (2006.01)
  *G11C 5/02* (2006.01)
  *H03K 19/177* (2020.01)
  *G11C 11/407* (2006.01)
  *G11C 11/408* (2006.01)
  *G11C 11/4097* (2006.01)
  *G11C 11/4094* (2006.01)
  *G11C 8/12* (2006.01)
  *G11C 11/405* (2006.01)
  *G11C 11/4096* (2006.01)

(52) U.S. Cl.
  CPC ....... *G11C 11/4094* (2013.01); *G11C 11/4096* (2013.01); *G11C 11/4097* (2013.01)

(56) References Cited

U.S. PATENT DOCUMENTS

| | | | |
|---|---|---|---|
| 2005/0152199 A1* | 7/2005 | Park | G11C 7/18 365/222 |
| 2009/0059685 A1* | 3/2009 | Houston | G11C 11/413 365/189.09 |
| 2011/0026314 A1 | 2/2011 | Hamouche et al. | |
| 2011/0205787 A1* | 8/2011 | Salters | G11C 11/412 365/154 |
| 2013/0051131 A1 | 2/2013 | Abouzeid et al. | |
| 2017/0110180 A1 | 4/2017 | Guo et al. | |
| 2017/0345505 A1 | 11/2017 | Noel et al. | |
| 2020/0020373 A1* | 1/2020 | Makosiej | G11C 7/20 |

OTHER PUBLICATIONS

Preliminary Search Report for French Application No. 1763221, dated Sep. 24, 2018.

Chang et al., Low-cost inter-linked subarrays (LISA): enabling fast inter-subarray data movement in DRAM. 2016 IEEE Symposium on High Performance Computer Architecture (HPCA). Mar. 2016:568-80.

* cited by examiner

MEMORY CIRCUIT

CROSS-REFERENCE TO RELATED APPLICATIONS

This application claims priority to French patent application number 1763221, filed on Dec. 26, 2017, which is incorporated herein by reference in its entirety.

BACKGROUND

The present disclosure concerns the field of memory circuits. It more particularly aims at a memory circuit capable of implementing calculation operations having data stored in the circuit as operands, and/or of implementing data transfers between different storage areas of the circuit.

DISCUSSION OF THE RELATED ART

FIG. 1 is an electric diagram illustrating an example of an elementary cell 10 of a memory circuit.

Elementary cell 10 of FIG. 1 is a cell comprising ten transistors. It comprises a SRAM storage cell 12 comprising four transistors, two read access ports RPT and RPF comprising two transistors each, and one write access port WP comprising two transistors. Storage cell 12 comprises two inverters 14 and 16 (each comprising two transistors) assembled in antiparallel between a first data bit storage node BLTI and a second node BLFI for storing a data bit complementary to the bit stored on node BLTI. Write access port WP comprises a transistor T1 coupling, by its conduction nodes, node BLTI to a first write conductive track WBLT, and a transistor T4, coupling, by its conduction nodes, node BLFI to a second write conductive track WBLF. The gates of transistors T1 and T4 are coupled to a write control conductive track WWL. Read access port RPT comprises two transistors T2 and T3 series-assembled, via their conduction nodes, between a node GND of application of a reference potential of the cell, for example, the ground, and a first readout conductive track RBLT. Transistor T2 is located on the side of node GND and has its gate connected to node BLTI, and transistor T3 is located on the side of track RBLT and has its gate connected to a conductive readout control track RWL. Read access port RPF comprises two transistors T5 and T6 series-assembled via their conduction nodes between reference node GND and a second readout conductive track RBLF. Transistor T5 is located on the side of node GND and has its gate connected to node BLFI, and transistor T6 is located on the side of track RBLF and has its gate connected to readout control conductive track RWL.

A memory circuit conventionally comprises a plurality of elementary cells 10 of the type described in relation with FIG. 1, identical or similar, arranged in an array of rows and columns. The cells of a same row are interconnected via their conductive tracks WWL, respectively RWL, and the cells of a same column are interconnected via their conductive tracks RBLT, respectively WBLT, respectively RBLF, respectively WBLF.

To perform an operation of reading from an elementary cell 10 of the memory, output conductive tracks RBLT and RBLF of the cell are precharged to a high-level potential, that is, to a potential which is positive with respect to the reference potential of node GND. Transistors T3 and T6 of the cell are then turned on by application of a high-level potential to conductive track RWL of the cell. After the activation of transistors T3 and T6, conductive track RBLT discharges if the potential of node BLTI is at a high level (transistor T2 on) and remains substantially at its precharge level if the potential of node BLTI is at a low level (transistor T2 off). Similarly, conductive track RBLF discharges if the potential of node BLFI is at a high level (transistor T5 on) and remains substantially at its precharge level if the potential of node BLFI is at a low level (transistor T5 off). The reading of the potential of track RBLT and/or of track RBLF via a readout circuit, not shown, for example, arranged at the foot of the column, enables to determine the value of the data bit stored in the elementary cell.

To perform an operation of writing into an elementary cell 10 of the memory, a high-level potential is applied to write conductive track WBLT and a low-level potential is applied to write conductive track WBLF, or conversely according to the value of the data bit to be written. Transistors T1 and T4 of the cell are then turned on by application of a high-level signal to conductive track WWL of the cell. The potential levels applied to conductive tracks WBLT and WBLF are then respectively stored on storage nodes BLTI and BLFI, until the next write operation.

A memory circuit capable not only of storing data, but also of executing, in situ, during accesses to the memory content, a number of logic and/or arithmetic operations having as operands data stored in the memory, has further already been provided in European patent application No 17172088.1 filed by the applicant on May 19, 2017 under priority of French patent application No 16/54623 of May 24, 2016. This circuit comprises, as in a conventional memory circuit, a plurality of elementary cells, for example, of the type described in relation with FIG. 1, arranged in rows and columns, and a control circuit capable of implementing data read or write operations in rows or portions of rows of the array. Unlike a conventional memory circuit where only one row of the array can be selected at a time during a read operation, the control circuit is capable of simultaneously selecting in read mode a plurality of rows of the array to perform a logic operation having as operands the data contained in the selected rows.

It would be desirable to at least partly improve certain aspects of known memory circuits.

SUMMARY

Thus, an embodiment provides a memory circuit comprising a plurality of elementary cells, each comprising:
a storage cell comprising a first data bit storage node;
a first read access port comprising a first transistor coupled by its gate to the first storage node, and a second transistor series-assembled with the first transistor between a first node of application of a reference potential of the cell and a first conductive track of the cell; and
a first read and write access port comprising a third transistor coupling the first storage node of the cell to the first conductive track of the cell, the gate of the second transistor being coupled to a second conductive track of the cell and the gate of the third transistor being coupled to a third conductive track of the cell,
wherein the elementary cells are arranged in a plurality of arrays, each comprising a plurality of rows and a plurality of columns, and wherein:
in each array, the elementary cells of a same row of the array share a same second conductive track and a same third conductive track; and
the elementary cells having the same coordinates in the different arrays share a same first conductive track.

According to an embodiment, the first read and write access port of each elementary cell further comprises a fourth transistor coupling the first storage node to a fourth conductive track of the cell and, in each array, the elementary cells of a same column of the array share a same fourth conductive track.

According to an embodiment:

in each elementary cell, the storage cell further comprises a second node for storing a data bit complementary to the bit stored on the first storage node;

each elementary cell comprises a second read access port comprising a fifth transistor coupled by its gate to the second storage node of the cell, a sixth transistor series-assembled with the fifth transistor between the first node of application of a reference potential of the cell and a fifth conductive track of the cell;

each elementary cell comprises a second read and write access port comprising a seventh transistor coupling the second storage node of the cell to the fifth conductive track of the cell, the gate of the sixth transistor being coupled to the second conductive track of the cell and the gate of the seventh transistor being coupled to the third conductive track of the cell; and the elementary cells having the same coordinates in the different arrays share a same fifth conductive track.

According to an embodiment, the second read and write access port of each elementary cell further comprises an eighth transistor coupling the second storage node of the cell to a sixth conductive track of the cell and, in each array, the elementary cells of a same column of the array share a same sixth conductive track.

According to an embodiment, in each elementary cell, the storage cell comprises two inverters assembled in antiparallel.

According to an embodiment, the different arrays are respectively formed in a plurality of stacked semiconductor levels of an integrated circuit.

According to an embodiment, in each array, the elementary cells of a same row have their first nodes connected to a same conductive track of application of a reference potential, the elementary cells of different rows having their first nodes connected to different conductive tracks of application of a reference potential, and the elementary cells of different arrays having their first nodes connected to different conductive tracks of application of a reference potential.

According to an embodiment, the memory circuit further comprises, for each first conductive track, an elementary precharge cell comprising a transistor coupling the first conductive track to a node of application of a high power supply potential of the circuit.

According to an embodiment, the memory circuit further comprises, for each first conductive track, an elementary logic circuit connected to the first conductive track.

According to an embodiment, the elementary logic circuits are manufactured in CMOS technology or in ReRAM technology.

According to an embodiment, the memory circuit further comprises a control circuit capable of simultaneously applying:

on the second conductive track of a first row of a first array of the memory circuit, a signal for controlling to the on state the second transistors of the cells of the first row; and on the third conductive track of a second row of a second array of the memory circuit, the cells of the second row being connected to the same first conductive tracks as the cells of the first row, a signal for controlling to the on state the third transistors of the cells of the second row.

BRIEF DESCRIPTION OF THE DRAWINGS

The foregoing and other features and advantages will be discussed in detail in the following non-limiting description of specific embodiments in connection with the accompanying drawings, among which.

DETAILED DESCRIPTION

Figure 1:
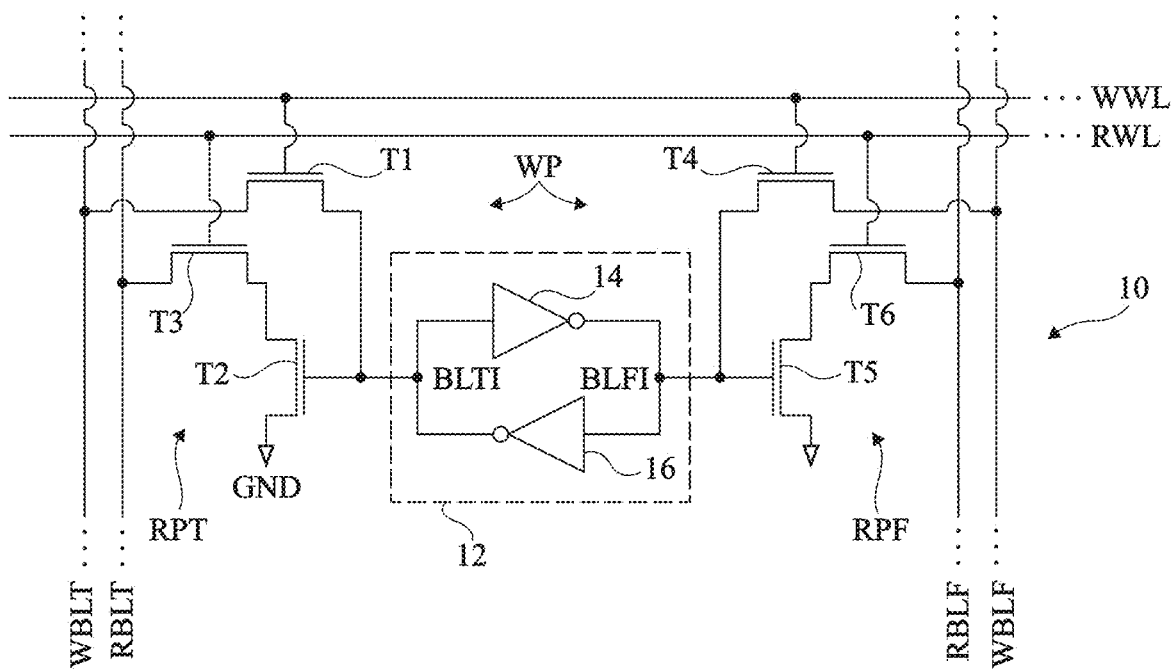
FIG. 1, previously described, is an electric diagram of an example of an elementary cell of a memory circuit.

The same elements have been designated with the same reference numerals in the different drawings. For clarity, only those steps and elements which are useful to the understanding of the described embodiments have been shown and are detailed. In particular, the forming of the input/output and/or control peripheral circuits of the described memory circuits has not been detailed, the forming of such circuits being within the abilities of those skilled in the art based on the indications of the present disclosure. In the present description, references to high- and low-level signals should be interpreted relatively, as corresponding to two different states of the binary signals processed by the described circuits. As an example, a high-level potential corresponds to a potential in the order of a high power supply voltage VDD of the described circuits (for example, equal to VDD to within 10% or to VDD to within 0.3 V), and a low-level potential corresponds to a potential in the order of a low power supply potential GND of the described circuits (for example, equal to GND to within 10% or to VDD to within 0.3 V). In the present description, the term "connected" is used to designate a direct electric connection, with no intermediate electronic component, for example, by means of one or a plurality of conductive tracks, and the term "coupled" or the term "linked" is used to designate a connection which may be direct (then meaning "connected") or which may be performed via one or a plurality of components.

Figure 2:
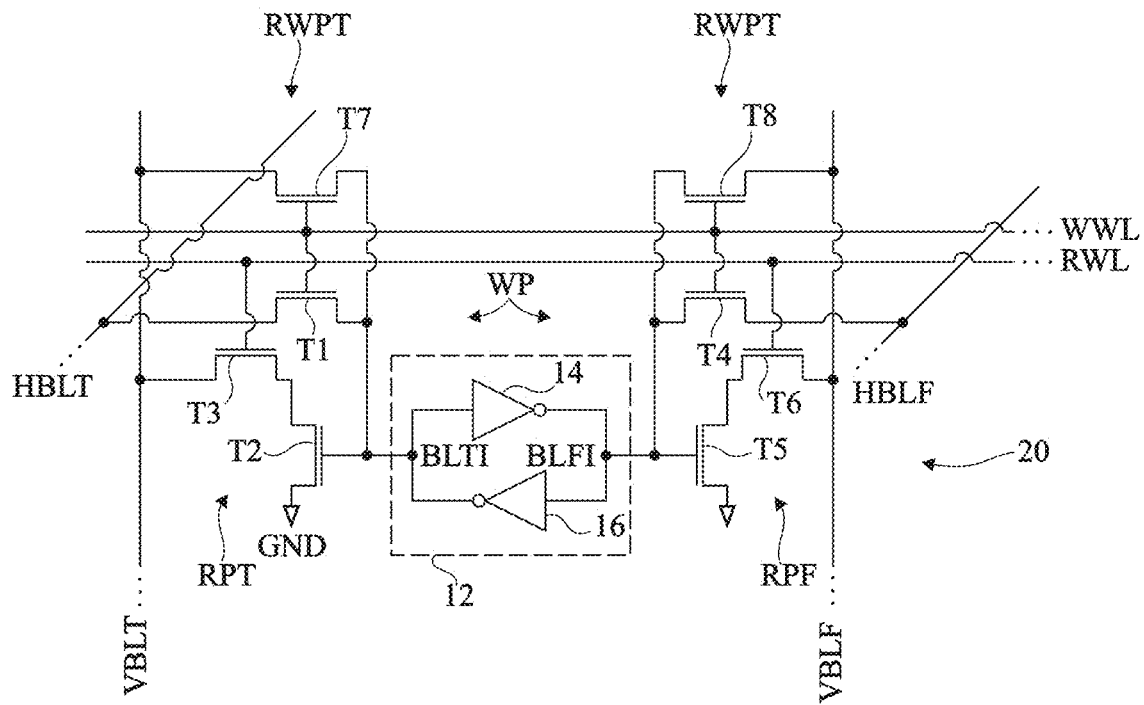
FIG. 2 is an electric diagram of an example of an elementary cell of a memory circuit according to another embodiment.

FIG. 2 is an electric diagram illustrating an example of an elementary cell 20 of a memory circuit.

Elementary cell 20 of FIG. 2 is a cell comprising twelve transistors. It comprises elements in common with cell 10 of FIG. 1. In particular, cell 20 of FIG. 2 comprises a SRAM storage cell 12 comprising four transistors, identical or similar to cell 12 of FIG. 1, and two read access ports RPT and RPF comprising two transistors each. Cell 20 of FIG. 2 further comprises two read/write access ports RWPT and RWPF comprising two transistors each.

More particularly, read/write access port RWPT comprises a transistor T1 coupling, by its conduction nodes, node BLTI to an access conductive track HBLT, and a transistor T7 coupling, by its conduction nodes, node BLTI to an access conductive track VBLT. The gates of transistors T1 and T7 are coupled to a same control conductive track WWL. Read access port RPT comprises two transistors T2 and T3 series-assembled, via their conduction nodes, between a node GND of application of a reference potential of the cell, for example, the ground or a low power supply potential of the circuit, and access conductive track VBLT. Transistor T2 is located on the side of node GND and has its gate connected to node BLTI, and transistor T3 is located on the side of track VBLT and has its gate connected to a control conductive track RWL.

In the shown example, transistor T1 has a first conduction node connected to node BLTI and a second conduction node connected to track HBLT, transistor T2 has a first connection node connected to node GND and a second conduction node connected to a first conduction node of transistor T3, the second conduction node of transistor T3 being connected to track VBLT, and transistor T7 has a first conduction node connected to node BLTI and a second conduction node connected to track VBLT. Further, in this example, the gates of transistors T1, T2, T3, and T7 are respectively connected to track WWL, to node BLTI, to track RWL, and to track WWL.

Read/write access port RWPF comprises a transistor T4 coupling, by its conduction nodes, node BLFI to an access conductive track HBLF, and a transistor T8 coupling, by its conduction nodes, nodes BLFI to an access conductive track VBLF. The gates of transistors T4 and T8 are coupled to control conductive track WWL. Read access port RPF comprises two transistors T5 and T6 series-assembled, via their conduction nodes, between a node GND of application of a reference potential of the cell, for example, the ground, and access conductive track VBLF. Transistor T5 is located on the side of node GND and has its gate connected to node BLFI, and transistor T6 is located on the side of track VBLF and has its gate connected to control conductive track RWL.

In the shown example, transistor T4 has a first conduction node connected to node BLFI and a second conduction node connected to track HBLF, transistor T5 has a first conduction node connected to node GND and a second conduction node connected to a first conduction node of transistor T6, the second conduction node of transistor T6 being connected to track VBLT, and transistor T8 has a first conduction node connected to node BLFI and a second conduction node connected to track VBLF. Further, in this example, the gates of transistors T4, T5, T6, and T8 are respectively connected to track WWL, to node BLFI, to track RWL, and to track WWL.

In the shown example, transistors T1, T2, T3, T4, T5, T6, T7, and T8 are N-channel MOS transistors, the conduction nodes of the transistors being their source and drain nodes.

Figure 3:
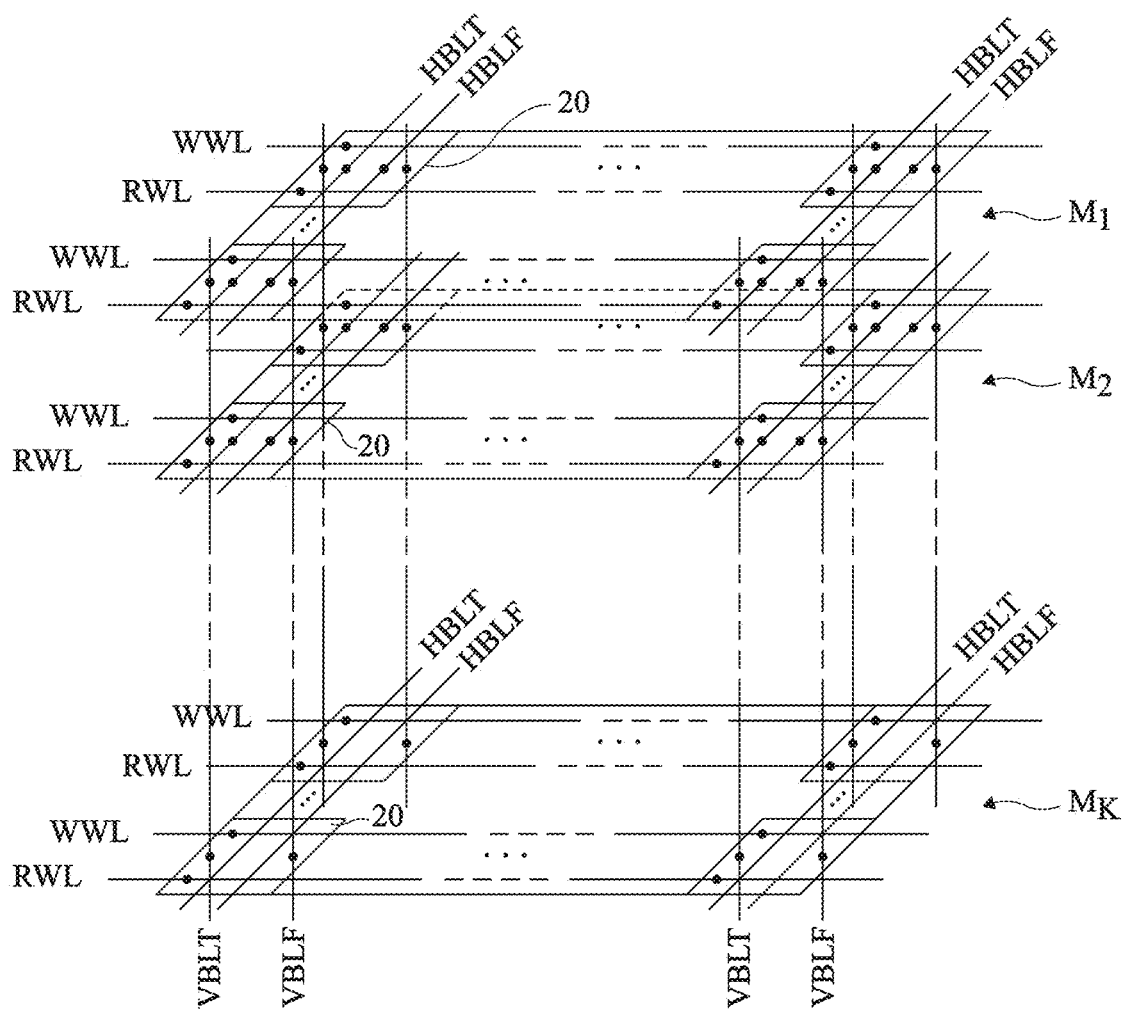
FIG. 3 is a simplified diagram of an example of a memory circuit according to an embodiment.

FIG. 3 is a simplified diagram of an example of a memory circuit according to an embodiment. The memory circuit of FIG. 3 comprises a plurality of elementary cells 20 of the type described in relation with FIG. 2, identical or similar, arranged in K arrays $M_1, \ldots, M_K$ of a plurality of cells each, where K is an integer greater than or equal to 2. In this example, the different arrays of the memory circuit are of same dimensions and each comprise a plurality of rows and plurality of columns of elementary cells 20.

FIG. 3 illustrates a preferred embodiment where the different arrays $M_1, \ldots, M_K$ of the memory circuit are stacked. As an example, the K arrays $M_1, \ldots, M_K$ are respectively formed in K stacked semiconductor levels of a 3D integrated circuit, that is, an integrated circuit comprising a plurality of stacked semiconductor levels interconnected by vertical vias, for example, a 3D monolithic circuit formed according to the 3D CoolCube™ integration technology developed by the CEA Leti (for example, described in P. Batude et al.'s article entitled "3D sequential integration opportunities and technology optimization", IEEE International Interconnect Technology Conference, 2014, pages 373-376). The described embodiments are however not limited to this specific layout of arrays $M_1, \ldots, M_K$.

In each array $M_i$, i being an integer in the range from 1 to K, the cells of a same row of the array are interconnected via their conductive tracks WWL, respectively RWL, and the cells of a same column of the array are interconnected via their conductive tracks HBLT, respectively HBLF. In other words, the cells of a same row of array $M_i$ share a same conductive track WWL and a same conductive track RWL, and the cells of a same column of array $M_i$ share a same conductive track HBLT and a same conductive track HBLF. The cells of different rows of a same array $M_i$ are connected to different conductive tracks WWL, respectively RWL, and the cells of different columns of a same array $M_i$ are connected to different conductive tracks HBLT, respectively HBLF. Further, the cells of different arrays are connected to different conductive tracks WWL, respectively RWL, respectively HBLT, respectively HBLF.

In the example of FIG. 3, the elementary cells 20 having the same coordinates (that is, the same row index and the same column index) in the different arrays $M_i$ are interconnected via their conductive tracks VBLT, respectively VBLF. In other words, the cells having the same coordinates in the different arrays $M_i$ share a same conductive track VBLT and a same conductive track VBLF. In each array $M_i$, the different cells of the array are connected to different conductive tracks VBLT, respectively VBLF.

To perform an operation of reading from an elementary cell 20 of the memory, conductive tracks VBLT and VBLF of the cell are precharged to a high-level potential, that is, to a potential which is positive with respect to the reference potential of node GND. Transistors T3 and T6 of the cell are then turned on by application of a high-level potential to conductive track RWL of the cell. Transistors T1, T7, T4, and T8 of the cells of the source row are maintained off by application of a low-level potential on conductive track WWL of the cell. After the activation of transistors T3 and T6, conductive track VBLT discharges if the potential of node BLTI is at a high level (transistor T2 on) and remains substantially at its precharge level if the potential of node BLTI is at a low level (transistor T2 off). Similarly, conductive track VBLF discharges if the potential of node BLFI is at a high level (transistor T5 on) and remains substantially at its precharge level if the potential of node BLFI is at a low level (transistor T5 off). The reading of the potential of track VBLT and/or of track VBLF via a readout circuit, not shown, enables to determine the value of the data bit stored in the elementary cell.

To perform an operation of writing into an elementary cell 20 of the memory, a high-level potential is applied to conductive track VBLT and a low-level potential is applied to conductive track VBLF, or conversely according to the value of the data bit to be written. Conductive tracks HBLT and HBLF may be maintained at a high-level potential. Transistors T1, T7, T4, and T8 of the cell are then turned on by application of a high-level signal to conductive track WWL of the cell. The potential levels applied to conductive tracks VBLT and VBLF are then respectively stored on storage nodes BLTI and BLFI, until the next write operation.

As a variation, the read or write operations may be implemented via conductive tracks HBLT and HBLF, without passing through conductive tracks VBLT and VBLF.

The memory circuit of FIG. 3 further enables to easily perform operations of data transfer between different arrays of the circuit.

As an example, the memory circuit of FIG. 3 enables to perform an operation of copying or of transfer of the content of a row of an array $M_i$ of the memory, here called source row, into a row of same index of an array $M_j$ of the memory, here called destination row, where j is an integer in the range from 1 to K, i being different from j.

To perform such a transfer operation, conductive tracks VBLT and VBLF of the cells of the source and destination rows are precharged to a high-level potential, and then left floating. Transistors T3 and T6 of the cells of the source row are then turned on by application of a high-level potential to conductive track RWL of the row. Transistors T1, T7, T4, and T8 of the cells of the source row are maintained off by application of a low-level potential on conductive track WWL of the row. Further, transistors T1, T7, T4, and T8 of the cells of the destination row are turned on by application of a high-level potential on conductive track WWL of the row. Transistors T3 and T6 of the cells of the destination row are maintained off by application of a low-level potential on conductive track RWL of the row. During the transfer operation, conductive tracks HBLT and HBLF of the cells of the destination row are maintained at a high-level potential.

As an example, during the transfer operation, conductive tracks RWL and WWL of the other rows of source array $M_i$ and conductive tracks RWL and WWL of the other rows of destination array $M_j$ are maintained at a low-level potential. Conductive tracks HBLT and HBLF of the cells of the source row may be maintained at a high-level potential. Conductive tracks RWL and WWL of the rows of the other arrays of the memory circuit may, if need be, be maintained at a low-level potential, and conductive tracks HBLT and HBLF of the cells of the other arrays of the memory circuit may be maintained at a high-level potential.

For each cell of the source row, the conductive track VBLT connected to the cell discharges if the potential of node BLTI is at a high level (transistor T2 on) and remains substantially at its precharge level if the potential of node BLTI is at a low level (transistor T2 off). Similarly, the conductive track VBLF connected to the cell discharges if the potential of node BLFI is at a high level (transistor T5 on) and remains substantially at its precharge level if the potential of node BLFI is at a low level (transistor T5 off). In the corresponding cell of the destination row, that is, in the cell of the destination row connected to the same conductive tracks VBLT and VBLF, transistors T7 and T8 being on, the potential levels applied to conductive tracks VBLT and VBLF are respectively stored on storage nodes BLTI and BLFI of the cell. Thus, the content of each cell of the source row is copied into the corresponding cell of the destination row. The maintaining at a same high-level potential of conductive tracks HBLT and HBLF of each cell in the destination row results in that the setting to the on state of transistors T1 and T4 does not disturb the copying of the data of the source row into the destination row.

It should be noted that similarly, the content of a source row may be simultaneously copied into a plurality of destination rows of different arrays of the memory circuit, sharing the same conductive tracks VBLT and VBLF. Further, a plurality of source rows having different indexes, belonging to a same source array or to different source arrays, may be simultaneously copied into corresponding destination rows of a same destination array or of a plurality of destination arrays.

Thus, a memory circuit of the type described in relation with FIG. 3 enables to perform operations of direct data transfer between different arrays $M_i$ of the circuit, without passing through peripheral input/output circuits of the circuit.

The memory circuit of FIG. 3 further enables to easily perform calculation operations between data belonging to different arrays of the circuit.

As an example, the memory circuit of FIG. 3 enables to perform a logic calculation operation between the content of a row of a first array $M_i$, here called first operand row, and the content of a row of same index of a second array $M_{i'}$ (i' being an integer in the range from 1 to K and i' different from i), here called second operand row, and to write the result of the operation into a row of same index of a third array $M_j$, here called destination row.

To perform such a calculation operation, the memory circuit is for example controlled similarly to what has been described hereabove for the implementation of an operation of copying of the content of a source row into a destination row, but for the fact that, this time, two source rows respectively corresponding to the first and second operand rows are simultaneously activated in read mode by application of a high-level potential on their respective conductive tracks RWL.

Thus, a memory circuit of the type described in relation with FIG. 3 enables to perform calculation operations having as operands data stored in the circuit, and to directly rewrite the result of the operations into the circuit without passing through peripheral input/output circuits of the circuit.

The memory circuit may comprise a control circuit, not shown, capable of implementing the various operations described hereabove.

Figure 4:
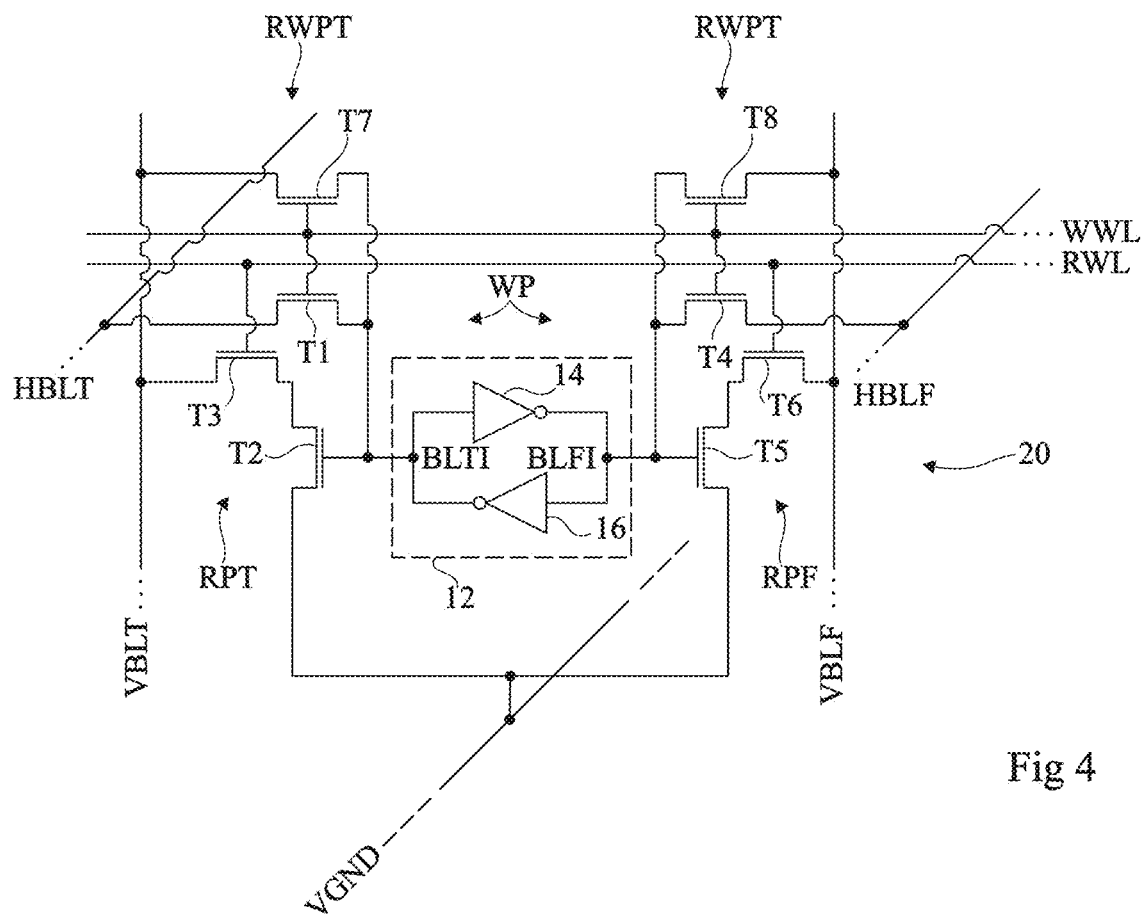
FIG. 4 illustrates an alternative embodiment of a memory circuit according to an embodiment.

FIG. 4 illustrates an alternative embodiment of a memory circuit of the type described in relation with FIGS. 2 and 3. In FIG. 4, a single elementary cell 20 of the circuit has been shown. Cell 20 of FIG. 4 comprises the same elements as cell 20 of FIG. 2, arranged substantially in the same way. The memory circuit of FIG. 4 differs from the memory circuit of FIG. 3 in that, in the example of FIG. 4, the conduction node of transistor T2 opposite to transistor T3 and the conduction node of transistor T5 opposite to transistor T6 rather than being directly to reference node GND, are connected to a conductive track VGND, or virtual ground.

In this example, in each array $M_i$ of the memory circuit, the cells of a same column of the array are interconnected via their conductive tracks VGND. In other words, the cells of a same column of array $M_i$ share a same conductive track VGND. The cells of different columns of a same array $M_i$ are connected to different conductive tracks VGND. Further, the cells of different arrays of the memory circuit are connected to different conductive tracks VGND.

The memory circuit of FIG. 4 enables to substantially perform the same operations as what has been previously described in relation with FIG. 3. To achieve this, in each column of each array $M_i$ of the memory circuit, conductive track VGND of the column is maintained at a low-level potential, for example, at the potential of reference node GND (not shown in FIG. 4) of the circuit.

The memory circuit of FIG. 4 further enables to perform an operation of partial copying of a source row of an array $M_i$ into a destination row of an array $M_j$. The partial copying operation is similar to the full copying operation described in relation with FIG. 3, but for the fact that, in the example of FIG. 4, the conductive tracks VGND of the cells of the source row, the content of which is not desired to be copied into the destination row, are maintained at a high-level potential. This enables, for each of these cells, and whatever the value of the bit stored in the cell, to prevent the discharge of conductive tracks VBLT and VBLF of the cell, which thus both remain in a high state. This enables not to overwrite the value stored in the corresponding cell of the destination row.

Indeed, to modify the value stored in a cell of the destination row, the potential levels applied to nodes BLTI and BLFI of the cell should be different.

Similarly, the circuit of FIG. 4 enables to perform a logic calculation operation between the content of a portion of a first operand row of an array $M_i$ and the content of a corresponding portion of a second operand row of an array $M_{i'}$, and to write the result of the operation into a corresponding portion of a destination row of an array $M_j$.

It should further be noted that in the memory circuit of FIG. 4, the conductive tracks VGND of the cells which are not concerned by the operations implemented in the circuit may be maintained at a high-level potential, which enables to limit leakage current through the different transistors of these cells.

As a variation, elementary cells 20 having the same coordinates in the different arrays $M_i$ are interconnected via their conductive tracks VGND. In other words, the cells having the same coordinates in the different arrays $M_i$ share a same conductive track VGND. In each array $M_i$, the different cells of the array are connected to different conductive tracks VGND.

Figure 5:
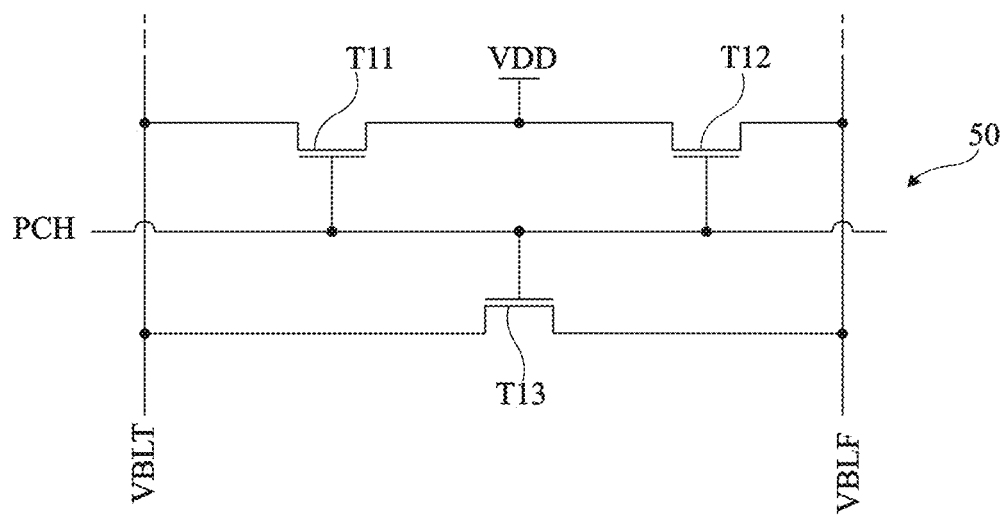
FIG. 5 is an electric diagram of an example of a precharge cell of a memory circuit according to an embodiment.

FIG. 5 is an electric diagram of an example of a precharge cell 50 of a memory circuit according to an embodiment.

A memory circuit of the type described in relation with FIG. 3 or 4 is considered herein. For each chain of elementary cells 20 interconnected by a same conductive track VBLF and by a same conductive track VBLT, an elementary precharge cell 50 connected to the conductive tracks VBLT and VBLF of the chain may be provided. As an example, the elementary precharge cells 50 are arranged in an array of same dimensions (same number of rows and of columns) as the arrays $M_i$ of the memory circuit. In the case of a 3D implementation such as shown in FIG. 3, the array of elementary precharge cells is for example formed in a semiconductor level different from the semiconductor levels where the different arrays $M_i$ of the memory circuit are formed.

In FIG. 5, a single precharge cell 50 has been shown. Cell 50 comprises two transistors T11 and T12 respectively coupling, by their conduction nodes, conductive track VBLT to a node or rail VDD of application of a high power supply potential of the circuit, and conductive track VBLF to node VDD. More particularly, transistor T11 has a first conduction node coupled, for example, connected, to track VBLT and a second conduction node coupled, for example, connected, to node VDD, and transistor T12 has a first conduction node coupled, for example, connected, to track VBLF and a second conduction node coupled, for example, connected, to node VDD. The gates of transistors T11 and T12 are connected to a same control conductive track PCH of the cell. Cell 50 of FIG. 5 further comprises a transistor T13 coupling, by its conduction nodes, track VBLT to track VBLF. More particularly, transistor T13 has a first conduction node coupled, for example, connected, to track VBLT, and a second conduction node coupled, for example, connected, to track VBLF. The gate of transistor T13 is connected to control node PCH of the cell. In the shown example, transistors T11, T12, and T13 are N-channel MOS transistors.

Cell 50 enables to precharge conductive tracks VBLT and VBLF to a high-level potential (substantially equal to the high power supply potential applied to node VDD), particularly for the implementation of read, calculation, or copying operations in the memory circuit. To achieve this, a high-level potential is applied to conductive track PCH, to turn on transistors T11, T12, and T13. Tracks VBLT and VBLF then charge to a potential substantially equal to that of node VDD. Transistor T13 (optional) enables to balance the charge of tracks VBLT and VBLF. Once the precharge is finished, the actual read, calculation, or copying operation may be implemented.

Figure 6:
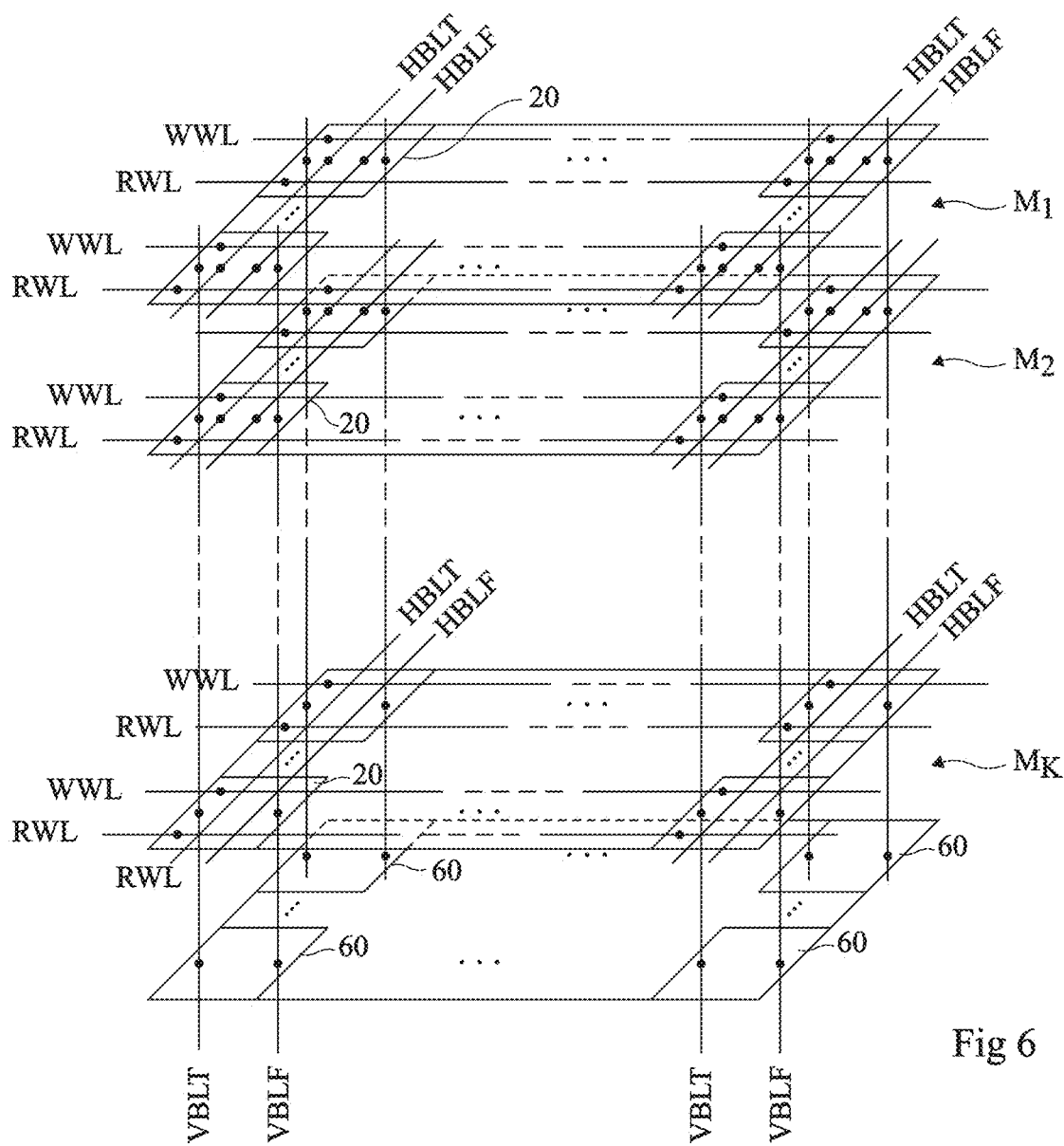
FIG. 6 is a simplified diagram of another variation of a memory circuit according to an embodiment.

FIG. 6 is a simplified diagram of another variation of a memory circuit according to an embodiment.

A memory circuit of the type described in relation with FIG. 3 or 4 is here considered. For each chain of elementary cells 20 interconnected by a same conductive track VBLF and by a same conductive track VBLT, the memory circuit further comprises an elementary logic circuit 60 comprising one or a plurality of logic gates (not detailed in the drawing), connected to conductive tracks VBLT and VBLF of the chain. Each elementary logic circuit 60 is for example a logic circuit identical or similar to elementary logic circuit 500 described in relation with FIGS. 5, 6, and 7 of above-mentioned European patent application No 17172088.1, which is incorporated herein by reference. Such a logic circuit particularly enables to perform additional calculation operations, and particularly arithmetical operations, having data stored in the memory as operands. As an example, the elementary logic circuits 60 are arranged in an array of same dimensions (same number of rows and of columns) as the arrays $M_i$ of the memory circuit. In the case of a 3D implementation such as shown in FIG. 3, the array of elementary logic circuits is for example formed in a semiconductor level different from the semiconductor levels where the different arrays $M_i$ of the memory circuit are formed.

More generally, in a memory circuit of the type described in relation with FIG. 3, one or a plurality of additional functional stages or levels may be provided, which additional stages may be formed in the same technology as the stages having arrays $M_i$ of the memory circuit formed therein, for example, in CMOS technology or in another technology, for example, in ReRAM (resistive random access memory) technology, that is, comprising non-volatile cells with a programmable resistance.

Specific embodiments have been described. Various alterations, modifications, and improvements will occur to those skilled in the art. In particular, it should be noted that although in the shown examples, the control transistors of elementary cells 20 (transistors T1, T2, T3, T4, T5, T6, T7, and T8) are N-channel MOS transistors, the described embodiments are not limited to this specific case. As a variation, all or some of the control transistors may be replaced with P-channel MOS transistors. It will then be within the abilities of those skilled in the art to adapt the control signals applied to the cells to obtain the desired operation.

Further, it should be noted that in the above-described embodiments, conductive tracks HBLT and HBLF and transistors T1 and T4 of elementary cells 20 enable to implement read and/or write operations directly in the corresponding array $M_i$, without passing through conductive tracks VBLT and VBLF. For certain applications, conductive tracks HBLT and HBLF and transistors T1 and T4 may however be omitted.

Further, in the above-described examples, elementary cells 20 are cells of differential type, that is, comprising two read access ports RPT and RPF and two read/write access ports RWPT and RWPF, enabling to access in parallel to two complementary storage nodes BLTI and BLFI of the cell. It will however be within the abilities of those skilled in the art to adapt the described embodiments to non-differential cells, that is, cells comprising a single storage node, a single read access port, and a single read/write access port.

Further, the described embodiments are not limited to the above-described examples where the elementary cells of the memory circuit are SRAM-type cells. More generally, the described embodiment may apply to other cell technologies, for example, ReRAM-type cells (non-volatile resistive memory) or DRAM-type cells (capacitive dynamic memory).

As an example, to form a ReRAM-type memory circuit, it may be provided, in cells 12 (FIGS. 1, 2, and 4) of the above-described examples, to replace the antiparallel association of two inverters with a series association of two resistive elements having a programmable resistance, a first end of said series association being coupled to a node of application of a high power supply potential of the cell, the second end of said series association being coupled to a node of application of a low power supply potential of the cell, and the intermediate node of said series association, or junction point of the two resistive elements, forming storage node BLTI of the cell.

As a variation, to form a DRAM-type memory circuit, it may be provided, in cells 12 (FIGS. 1, 2, and 4) of the above-described examples, to replace the antiparallel association of two inverters with a capacitive element having a first electrode coupled, for example, connected, to node BLTI, and a second electrode coupled, for example, connected, to a node of application of a reference potential of the cell.

The invention claimed is:

1. A memory circuit comprising a plurality of elementary cells, each elementary cell comprising:
   a storage cell comprising a first data bit storage node;
   a first read access port comprising a first transistor coupled by its gate to the first storage node, and a second transistor series-assembled with the first transistor between a first node of application of a reference potential of the elementary cell and a first conductive track of the elementary cell; and
   a first read-and-write access port comprising a third transistor coupling the first storage node of the storage cell to the first conductive track of the elementary cell, the gate of the second transistor being coupled to a second conductive track of the elementary cell and the gate of the third transistor being coupled to a third conductive track of the elementary cell,
   wherein the plurality of elementary cells are arranged in a plurality of arrays, each comprising a plurality of rows and a plurality of columns, wherein:
   in each array, the elementary cells of a same row of the array share a same second conductive track and a same third conductive track; and
   a first group of the elementary cells having same coordinates in the different arrays share a same first conductive track,
   and wherein the different arrays are respectively formed in a plurality of stacked semiconductor levels of an integrated circuit.

2. The memory circuit of claim 1, wherein the first read-and-write access port of each elementary cell further comprises a fourth transistor coupling the first storage node to a fourth conductive track of the elementary cell and wherein, in each array, the elementary cells of a same column of the array share a same fourth conductive track.

3. The memory circuit of claim 1, wherein:
   in each elementary cell, the storage cell further comprises a second node for storing a data bit complementary to the bit stored on the first storage node;
   each elementary cell comprises a second read access port comprising a fifth transistor coupled by its gate to the second storage node of the cell, a sixth transistor series-assembled with the fifth transistor between the first node of application of a reference potential of the elementary cell and a fifth conductive track of the elementary cell;
   each elementary cell comprises a second read-and-write access port comprising a seventh transistor coupling the second storage node of the storage cell to the fifth conductive track of the elementary cell, the gate of the sixth transistor being coupled to the second conductive track of the elementary cell and the gate of the seventh transistor being coupled to the third conductive track of the elementary cell; and
   a second group of elementary cells having same coordinates in the different arrays share a same fifth conductive track.

4. The memory circuit of claim 3, wherein the second read-and-write access port of each elementary cell further comprises an eighth transistor coupling the second storage node of the storage cell to a sixth conductive track of the elementary cell and wherein, in each array, the elementary cells of a same column of the array share a same sixth conductive track.

5. The memory circuit of claim 1, wherein, in each elementary cell, the storage cell comprises two inverters assembled in antiparallel.

6. The memory circuit of claim 1, wherein, in each array, the elementary cells of a same row have their first nodes connected to a same conductive track of application of a reference potential, the elementary cells of different rows having their first nodes connected to different conductive tracks of application of a reference potential, and the elementary cells of different arrays having their first nodes connected to different conductive tracks of application of a reference potential.

7. The memory circuit of claim 1, further comprising, for each first conductive track, an elementary precharge cell comprising a transistor coupling the first conductive track to a node of application of a high power supply potential of the circuit.

8. The memory circuit of claim 1, further comprising, for each first conductive track, an elementary logic circuit connected to the first conductive track, the elementary logic circuit being capable of implementing calculation operations having as operands data stored in the memory circuit.

9. The memory circuit of claim 8, wherein the elementary logic circuits are formed in CMOS technology or in ReRAM technology.

10. The memory circuit of claim 1, further comprising a control circuit capable of simultaneously applying:
    on the second conductive track of a first row of a first array of the memory circuit, a signal for controlling to the on state the second transistors of the elementary cells of the first row; and
    on the third conductive track of a second row of a second array of the memory circuit, the elementary cells of the second row being connected to the same first conductive tracks as the elementary cells of the first row, a signal for controlling to the on state the third transistors of the second row.

* * * * *